(12) United States Patent
Smalley

(10) Patent No.: US 10,474,101 B2
(45) Date of Patent: Nov. 12, 2019

(54) CIRCULAR BUFFERS FOR LEAKY MODE DISPLAYS

(71) Applicant: Brigham Young University, Provo, UT (US)

(72) Inventor: Daniel Smalley, Provo, UT (US)

(*) Notice: Subject to any disclaimer, the term of this patent is extended or adjusted under 35 U.S.C. 154(b) by 0 days.

(21) Appl. No.: 15/955,646

(22) Filed: Apr. 17, 2018

(65) Prior Publication Data

US 2019/0113887 A1     Apr. 18, 2019

Related U.S. Application Data

(60) Provisional application No. 62/486,302, filed on Apr. 17, 2017.

(51) Int. Cl.
| | | |
|---|---|---|
| *G03H 1/22* | (2006.01) | |
| *G02F 1/01* | (2006.01) | |
| *G03H 1/00* | (2006.01) | |
| *G03H 1/02* | (2006.01) | |
| *H03H 9/25* | (2006.01) | |
| *H03H 9/02* | (2006.01) | |

(52) U.S. Cl.
CPC .......... *G03H 1/2294* (2013.01); *G02F 1/011* (2013.01); *G03H 1/0005* (2013.01); *G03H 1/02* (2013.01); *H03H 9/25* (2013.01); *G03H 2001/0088* (2013.01); *G03H 2001/0224* (2013.01); *G03H 2225/21* (2013.01); *H03H 9/02551* (2013.01); *H03H 9/02559* (2013.01)

(58) Field of Classification Search
CPC ...... G03H 1/2294; G03H 1/02; G03H 1/0005; G02F 1/011; H03H 9/25
See application file for complete search history.

(56) References Cited

U.S. PATENT DOCUMENTS

| | | | |
|---|---|---|---|
| 10,317,677 B2* | 6/2019 | Levola | G02B 27/0172 |
| 2004/0080938 A1* | 4/2004 | Holman | F21S 8/08 |
| | | | 362/231 |
| 2016/0223988 A1* | 8/2016 | Bove, Jr. | G03H 1/2294 |

\* cited by examiner

*Primary Examiner* — Thomas A Hollweg
*Assistant Examiner* — Mary A El-Shammaa
(74) *Attorney, Agent, or Firm* — Strong & Hanni, PC; Joseph Shapiro

(57) ABSTRACT

A method and system for recycling signals in a leaky mode device for a holographic display or other application. A leaky mode device comprises at least a first transducer, a substrate, and a second transducer. The first transducer may be configured to receive an input signal from a signal arbiter, which forwards to the first transducer as an input signal either a new input signal or a recycled input signal (or some combination of the two). The first transducer converts the received input signal to a SAW (surface acoustic wave) and transmits the SAW through the substrate to the second transducer, which converts the received SAW to an output signal, and forwards the output signal to an amplifier, which amplifies the output signal (now a "recycled" signal) and forwards to the signal arbiter. This system facilitates persistence for points in a holographic display without the need for continually rewriting to leaky mode devices.

20 Claims, 1 Drawing Sheet

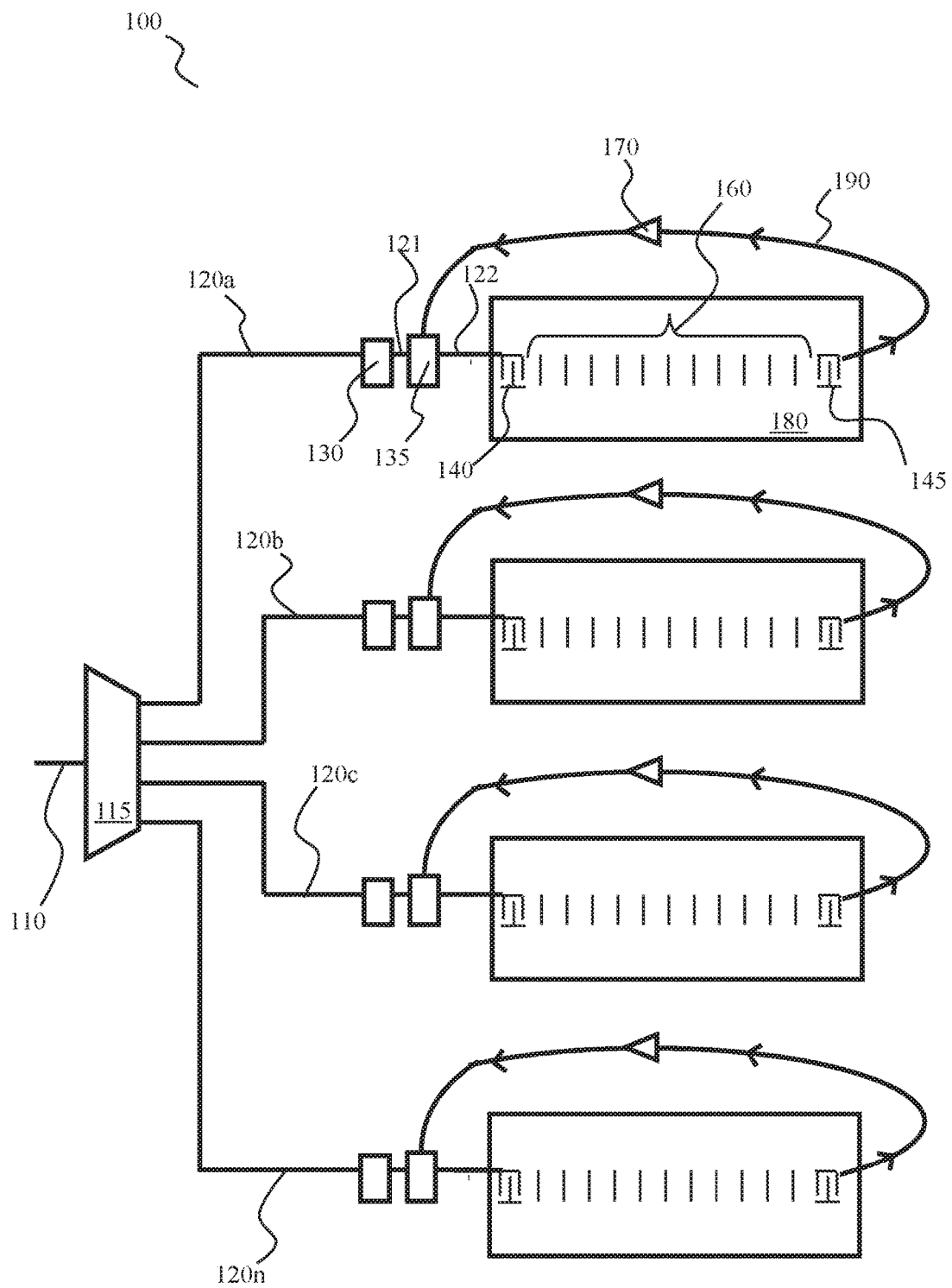

CIRCULAR BUFFERS FOR LEAKY MODE DISPLAYS

BACKGROUND OF THE INVENTION

Leaky mode systems may be used for holographic video, e.g., flatscreen, scanned aperture, and near-eye holographic video systems. In a leaky mode system, which generally comprises multiple leaky mode devices, surface acoustic waves ("SAW") for a leaky mode device may be generated by a "delay line" (or "channel") configuration that encodes and decodes electrical information to and from an acoustic wave so that the input information is the same as the output information. The encoding may happen at a transducer at the beginning of the delay line, and the decoding may happen at a transducer at the end of the delay line. Although the information is the same on the input signal and output signal the signal is, in general, attenuated when it arrives at the decoding transducer at the end of the delay line.

In leaky mode systems, it is often complex to drive large leaky mode arrays. Unlike non-leaky-mode systems, in which pixels persist once they are written, in a leaky-mode system pixels do not persist, but "run away" as SAWs traveling at thousands of meters per second across the substrate that is the medium for SAW wave propagation. In a leaky mode system, an image does not persist unless it is constantly rewritten.

For example, small aperture leaky mode devices must be updated frequently—e.g., every few microseconds. This frequent updating is complex and consumes resources, e.g., computing, electronics, and power resources. The resource consumption resulting from frequent updating is magnified in large leaky mode systems. Although "large" is not an exact term, a system with more than 18 channels may be considered "large." In general, each channel requires a VGA cable's worth of information (e.g., 400 million pixels per second per color channel). A single computer with three dual-head graphics cards might have up to 18 usable channels in a leaky mode system. In general, using more than 18 channels results in significant complexity and resource consumption for updating small aperture leaky mode devices that are part of an array of such devices.

What is needed are improvements to reduce the complexity of driving large leaky mode arrays.

BRIEF SUMMARY OF THE INVENTION

A system and method are disclosed for employing a circular buffer to provide leaky mode devices with an acoustic/electric memory without greatly increasing the complexity of the device architecture, thereby reducing the complexity of and resource consumption for driving large leaky mode arrays.

The "Circular Buffer System" disclosed herein may comprise a signal arbiter, a first SAW ("surface acoustic wave") transducer, a SAW substrate, a second. SAW transducer, an amplifier, and connections between the signal arbiter and the first transducer, the second transducer and the amplifier, and the amplifier and the signal arbiter. By recycling the signal from a SAW that has propagated through the substrate of a leaky mode device, the Circular Buffer System may provide a perception of persistence of one or more points in a holographic display.

In one embodiment, the signal arbiter may receive an RF input signal that is an RF encoding of a chirped SAW for generating a point in a holographic display. The signal arbiter may forward the RF input signal to the first transducer, which may convert the RF input signal to a SAW and launch the SAW to propagate across the substrate toward the second transducer. The second transducer may receive the SAW, convert back into an RF signal and forward the converted to an amplifier, which may amplify the RF signal and forward the amplified signal to the signal arbiter. This amplified signal may be referred to as a "recycled" signal. The signal arbiter may determine whether to reintroduce the recycled signal to the first transducer, or forward a new signal to the transducer, or forward to the transducer signal that is a function of or otherwise incorporates information from the recycled signal.

Recycling the signal after the SAW has propagated across the substrate may reduce the resource consumption that results from continually rewriting a new signal to the leaky mode device to achieve persistence of a holographic element or other output.

BRIEF DESCRIPTION OF THE DRAWINGS

FIG. 1 illustrates an exemplary array of four leaky mode channels as may be used in a holographic video application.

DETAILED DESCRIPTION OF THE INVENTION

This Application claims priority to U.S. Provisional Application No. 62/486,302, titled "Circular Buffers for Leaky Mode Displays," and filed on Apr. 17, 2017, and which is incorporated herein by reference in its entirety.

A system and method are disclosed for employing a circular buffer to provide leaky mode devices with an acoustic/electric memory without greatly increasing the complexity of the device architecture, thereby reducing the complexity of and resource consumption for driving large leaky mode arrays.

TABLE OF REFERENCE NUMBERS FROM DRAWINGS

The following table is for convenience only, and should not be construed to supersede any potentially inconsistent disclosure herein.

| Reference Number | Description |
| --- | --- |
| 100 | circular buffer system |
| 110 | input signal |
| 115 | multiplexer |
| 120a-n | multiplexer output signals (and channel input signals) |
| 121 | processed signal |
| 130 | intermediate processing components (amplifiers, filters, etc.) |
| 135 | signal arbiter |
| 140 | interdigital SAW transducer |
| 145 | receiving SAW transducer |
| 160 | SAW |
| 170 | amplifier for recycled signal |
| 180 | leaky mode channel |
| 190 | recycled return signal |

FIG. 1 shows a system for using a circular buffer to give small aperture leaky mode devices an acoustic/electric memory without greatly increasing the complexity of the device architecture. This system shall hereinafter be referred to as a "Circular Butler System."

In general, the Circular Buffer System described herein creates persistence in a leaky mode channel without the need to continually rewrite info on to a leaky mode channel. The Circular Buffer System accomplishes this by amplifying the leaky mode channel output signal and reintroducing the amplified signal as the input of the leaky mode channel. The process of amplifying the output signal and reintroducing as the input signal may be referred to "recycling." The signal may be recycled repeatedly, thereby creating persistence without having to write "new" information to the leaky mode channel. This can result in significant savings in resource consumption. Without recycling, creating perceived persistence on a leaky mode channel would require frequent and continual rewriting on the order of a million times per second to create a persistent display.

FIG. 1 shows an exemplary embodiment of a Circular Buffer System 100, which may comprise input signal 110, demultiplexer 115, demultiplexed input signals 120a-n, signal arbiter 135, SAW transducer 140, receiving SAW transducer 145, SAW 160, amplifier 170, leaky mode channel 180, and recycled return signal 190.

Input signal 110 may comprise an RF (radio frequency) signal. For example, input signal 110 may be an RF encoding of a chirped SAW for generating a point in a holographic display.

Demultiplexer 115 may demultiplex input signal 110 into two or more signals. As shown in FIG. 1, demultiplexer 115 may demultiplex input signal 110 into signals 120a, 120b, 120c, . . . 120n. Many demultiplexing solutions and components are known in the art and are within the scope and spirit of this disclosure.

As shown in FIG. 1, intermediate processing components 130 may include amplifiers, filters, and/or other intermediate electronics as are known in the art. For example, intermediate processing components 130 may include amplifiers, filters, switches, impedance matching networks, arbitrary waveform generators, dtoa converters, atod converters, and/or other processing components.

Signal arbiter 135, which may be a RF transistor, RF switch, analog switch, operation amplifier, or other similarly functioning electronics component known in the art, sends processed signal 121 to transducer 140. Signal arbiter 135 unit could also include summers or mixers or filters to combine or subtract signals with/from recycled signals.

Signal arbiter 135 may be configured to determine whether to write recycled data, e.g., from signal 190, to leaky mode channel 180, or to write new data, e.g., from signal 121, to leaky mode channel 180. Signal arbiter may be controlled by a control component or system, which may be hardware, software, or a combination of both, as is known in the art.

As shown in FIG. 1, signal arbiter 135 may be configured to send signal 121 to leaky mode channel 180, which may comprise transmitting surface acoustic wave ("SAW") transducer 140, SAW 160, receiving SAW transducer 145, return signal 190, and amplifier 170.

SAW transducer 140 may be a transducer configured to convert signal 121 by launching it as a surface acoustic wave 160 illuminated by continuous or pulsed light. Receiving SAW transducer 145 may be configured to pick up or receive SAW 160 and convert it from a SAW to an RF signal 190.

The SAW substrate, i.e., the medium through which SAW 160 propagates in leaky mode channel 180, may be lithium niobate or another SAW substrate such as lithium tantalate, lithium niobite, quartz, zinc oxide, or another piezoelectric substrate or semiconductor material.

As shown in FIG. 1, leaky mode channel 180 is effectively a SAW delay line.

Receiving SAW transducer 145 may convert the received acoustic signal back to an RF signal 190, which may then be processed, e.g., amplified using amplifier 170. Return signal 190 may be routed to signal arbiter 135, whereby signal 190 may be re-launched from SAW transducer 140.

Using Circular Buffer System 100, a leaky mode output may be repeated/recycled without having to be rewritten, thereby avoiding unnecessary resource consumption resulting from continual rewriting of the same information to a leaky mode channel.

In one alternative embodiment, new information may be added to signal 122 on each pass. For example, such information may be added by signal arbiter 135. For example, new view-information on a new carrier frequency (or frequencies) could be added to signal 122 on each pass until the full viewzone is filled (each carrier frequency maps to a different angle via holographic diffraction, and the viewzone of the display may be filled a piece at a time by writing one angle at a time), multiple carrier frequencies may be added to the same leaky mode channel, or a right-eye view could be added to a left-eye view or vice versa, or an additional element could be added (e.g., a holographic flower could be added to a bee hologram).

In another alternative embodiment, a form of compression could be employed by recycling holographic information that is redundant from frame to frame and modifying only (e.g., by extracting and replacing) signal content that changes, e.g., the bee-flower application described above.

Demultiplexed input signals 120b, 120c, and 120n from FIG. 1, along with their associated components and elements, are not specifically described herein because they function analogously to demultiplexed input signal 120a and its associated components and elements.

The disclosure herein may apply to multiple applications and various fields, including but not limited to holographic video, near-eye display, and other applications.

What is claimed is:

1. A leaky mode device, comprising:
   a first SAW transducer;
   a second SAW transducer;
   a substrate;
   a signal arbiter;
   an amplifier;
   a connection between the signal arbiter and the first transducer;
   a connection between the second SAW transducer and the amplifier; and
   a connection between the amplifier and the signal arbiter;
   wherein:
   the first SAW transducer and the substrate comprise a leaky mode device; and
   the signal arbiter is configured to forward at least part of a recycled signal to the first SAW transducer.

2. The device of claim 1; further comprising intermediate processing componentry for processing an input signal before the input signal is forwarded to the first SAW transducer.

3. The device of claim 2, There the intermediate processing componentry comprises at least one of an amplifier, filter, switch, impedance matching network, an arbitrary waveform generator, a dtoa converter, and an atod converter.

4. The device of claim 1, wherein the substrate is at least partially a piezoelectric substrate.

5. The device of claim 1, wherein the signal arbiter is configured with the capability to forward a recycled signal.

6. The device of claim 1, further comprising a control component in communication with the signal arbiter, wherein the control component controls the signal arbiter in selecting a signal source.

7. The device of claim 1, wherein the signal arbiter is configured to modify the recycled signal.

8. The device of claim 7, wherein being configured to modify the recycled signal comprises being configured to add new information on a new carrier frequency to the recycled signal.

9. The device of claim 7, wherein being configured to modify the recycled signal comprises being configured to add an additional holographic element to the recycled signal.

10. The device of claim 1, wherein the first SAW transducer is configured to convert an input signal into a SAW.

11. The device of claim 10, wherein the input signal is an RF signal.

12. The device of claim 11, wherein the RF input signal is an RF encoding of a chirped SAW for generating a point n a holographic display.

13. The device of claim 1, wherein the second SAW transducer is configured to convert a SAW into an output signal.

14. The device of claim 13, wherein the output signal is an RF signal.

15. A method for recycling a SAW in a leaky mode device, wherein:
   the leaky mode device comprises:
      a first SAW transducer;
      a second SAW transducer;
      a substrate;
      a signal arbiter;
      an amplifier;
      a first connection between the signal arbiter and the SAW first transducer;
      a second connection between the second SAW transducer and the amplifier; and
      a third connection between the amplifier and the signal arbiter;
   the first SAW transducer and the substrate comprise a leaky mode device; and
   the signal arbiter is configured to forward at least part of a recycled signal to the first SAW transducer; and
   comprising:
      determining, at the signal arbiter, whether to forward as an input signal a new input signal or a recycled output signal;
      forwarding, from the signal arbiter, the input signal to the first SAW transducer via the first connection;
      converting, at the first SAW transducer, the input signal to a SAW;
      transmitting the SAW through the substrate;
      receiving, at the second SAW transducer, the SAW;
      converting, at the second SAW transducer, the SAW into an output signal; and
      recycling the output signal by forwarding the output signal via the second connection to the amplifier, using the amplifier to amplify it, and transmitting it to the signal arbiter via the third connection.

16. The method of claim 15, wherein the substrate is at least partially a piezoelectric substrate.

17. The method of claim 15, wherein the input signal is an RF signal.

18. The method of claim 17, wherein the RF input signal is an RF encoding of a chirped SAW for generating a point in a holographic display.

19. The method of claim 15, wherein the output signal is an RF signal.

20. The method of claim 19, wherein the RF output signal is an RF encoding for a chirped SAW for generating a point in a holographic display.

* * * * *